United States Patent [19]

Ohta et al.

[11] Patent Number: 5,808,940
[45] Date of Patent: Sep. 15, 1998

[54] NONVOLATILE SEMICONDUCTOR MEMORY

[75] Inventors: Noriyuki Ohta; Noriaki Kodama; Toshikatsu Jinbo, all of Tokyo, Japan

[73] Assignee: NEC Corporation, Tokyo, Japan

[21] Appl. No.: 828,757

[22] Filed: Mar. 25, 1997

[30] Foreign Application Priority Data

Mar. 28, 1996 [JP] Japan .................................. 8-074508

[51] Int. Cl.$^6$ ................................................ G11C 16/04
[52] U.S. Cl. .............................. 365/185.29; 365/185.18; 365/226
[58] Field of Search ...................... 365/185.29, 185.18, 365/226

[56] References Cited

U.S. PATENT DOCUMENTS 5,491,656  2/1996  Sawada .............................. 365/185.29
5,586,075  12/1996  Miwa ................................. 365/185.29

FOREIGN PATENT DOCUMENTS 5182483  7/1993  Japan .

*Primary Examiner*—David C. Nelms
*Assistant Examiner*—VanThu Nguyen
*Attorney, Agent, or Firm*—Whitham, Curtis & Whitham

[57] ABSTRACT

A nonvolatile semiconductor memory includes a cell array prepared by arranging erasable and programmable memory cell transistors in rows and columns, word lines arranged in correspondence with the respective rows of the cell array and connected to the control gates of the memory cell transistors, digit lines arranged in correspondence with the respective columns of the cell array and connected to the drains of the memory cell transistors, source lines connected to the sources of the memory cell transistors, and a source power supply circuit for applying a source voltage to the source lines in an erase operation. This memory erases by the source voltage data in the memory cell transistors in the rows and columns of the cell array. The source power supply circuit is a circuit including a first P-channel transistor which sets a current to be supplied to the source lines to a predetermined value in the erase operation in a range wherein the source voltage is lower than a predetermined potential, and a second P-channel transistor which sets the current to be supplied to the source lines so as to decrease faster than the current decreased by the characteristic of the first transistor with an increase in source voltage in a range wherein the source voltage is higher than the predetermined potential.

5 Claims, 6 Drawing Sheets

FIG. IA PRIOR ART
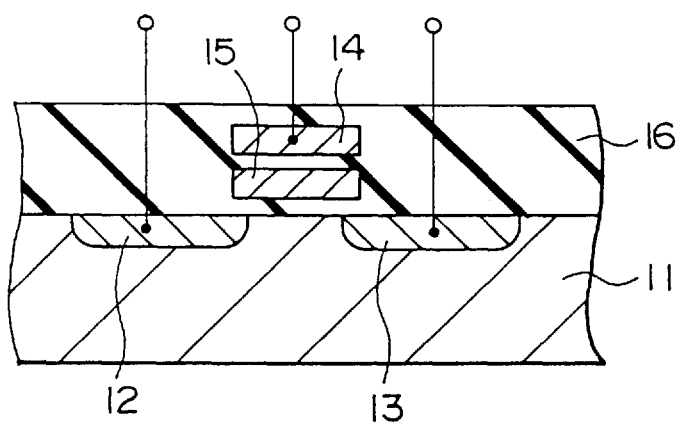
FIG. IB PRIOR ART
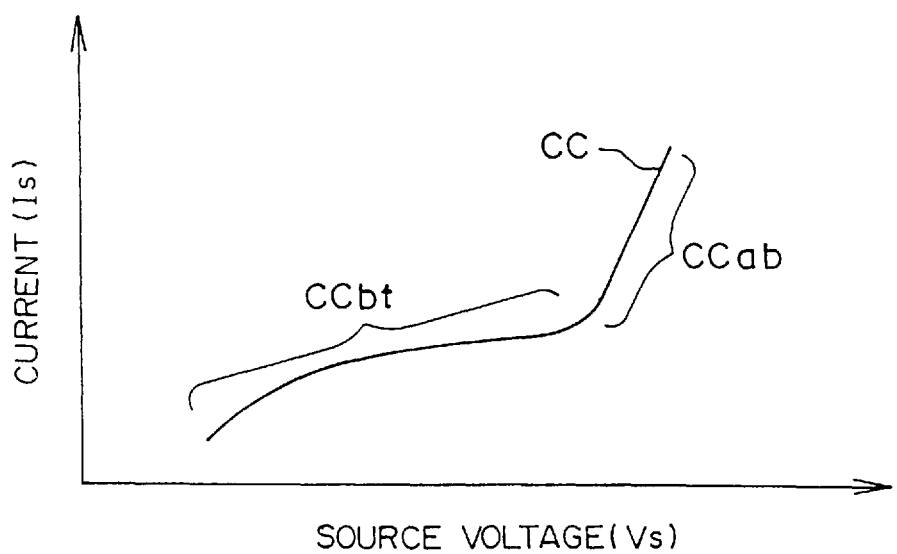

NONVOLATILE SEMICONDUCTOR MEMORY

BACKGROUND OF THE INVENTION

1. Field of the Invention

The present invention relates to a nonvolatile semiconductor memory and, more particularly, to an electrically erasable and programmable nonvolatile semiconductor memory.

2. Description of the Prior Art

A field effect transistor having a floating gate changes in threshold voltage in accordance with the charge amount accumulated in this floating gate. The change in threshold voltage is made to correspond to the data level, thereby storing data in a nonvolatile manner.

FIG. 1A is a sectional view showing such a field effect transistor. The threshold voltage of this field effect transistor is generally about 1 to 2 V in an initial state. When a source 12 is set at 0 V, and voltages of, e.g., about 12 V and about 6 to 8 V are respectively applied to a drain 13 and a control gate 14, electrons are injected in a floating gate 15 to increase the threshold voltage (write operation). At this time, if the threshold voltage (e.g., 6 V) is set higher than a voltage (e.g., 5 V) to be applied to the control gate 14 in a read operation, no current flows through the field effect transistor having this high threshold voltage in the read operation. However, a current flows through the field effect transistor in the initial state. Accordingly, stored data can be read out.

If the control gate 14 of the field effect transistor having the high threshold voltage is set at 0 V, the drain 13 is set in an open state, and a voltage of, e.g., about 12 V is applied to the source 12, electrons are extracted from the floating gate 15 to decrease the threshold voltage to about the initial voltage (erase operation).

FIG. 1B shows the relationship (to be referred to as a cell characteristic hereinafter) between the voltage (source voltage Vs) applied to the source 12 and the current (Is) flowing through the source in an erase operation.

A cell characteristic curve CC can be divided into a range (CCbt) of an inter-band tunnel current generated when the source voltage Vs is lower than a predetermined voltage, and a range (CCab) of an avalanche breakdown current generated when the source voltage Vs is higher than the predetermined voltage. In either portion, the source current flows through an insulating film 16. At this time, carriers are trapped in the insulating film 16 to degrade various memory cell characteristics (to be referred to as characteristics hereinafter). This degradation becomes typical particularly when the avalanche breakdown current flows. Therefore, the erase operation is normally performed within the range of the inter-band tunnel current to suppress the progress of degradation.

FIG. 2 is a partial circuit diagram showing, in an erase operation, a nonvolatile semiconductor memory having a cell array in which such field effect transistors are arranged as memory cells in a matrix of pluralities of rows and columns.

This nonvolatile semiconductor memory comprises a cell array 1 in which field effect transistors (to be referred to as memory cell transistors hereinafter) MT for forming memory cells are arranged in a matrix of pluralities of rows and columns, a plurality of word lines WL which are arranged in correspondence with the plurality of respective rows of the memory cell transistors MT of the cell array 1 and connected to the control gates of the memory cell transistors MT in corresponding rows, a plurality of digit lines DL which are arranged in correspondence with the plurality of respective columns of the memory cell transistors MT of the cell array and connected to the drains of the memory cell transistors MT in corresponding columns, a row selecting circuit 2 for selecting, in write and read operations, one of the plurality of word lines WL in accordance with an address signal AD and setting this line in a predetermined level, and setting all the plurality of word lines WL in a ground potential level (0 V) in an erase operation performed by an erase control signal ER of active level, and a source power supply circuit 3x for setting the sources of all the memory cell transistors MT of the cell array 1 to a ground potential (0 V) in write and read operations, and applying a predetermined source voltage Vs to the sources of all the memory cell transistors MT of the cell array 1 in an erase operation.

In the erase operation, all the digit lines DL are separated from a write circuit, a read circuit (neither are shown), and the like, and set in an open state.

In the erase operation, all the digit lines DL, i.e., the drains of all the memory cell transistors MT are in an open state, and all the word lines WL, i.e., the control gates of all the memory cell transistors MT are in a ground potential level. In addition, the source voltage Vs is applied from the source power supply circuit 3x to the sources of all the memory cell transistors MT to erase data in all the memory cell transistors MT at once.

FIGS. 3A and 3B are circuit diagrams, respectively, showing examples of the detailed circuit configuration of the source power supply circuit 3x.

FIG. 3A shows an example of the most general, basic conventional circuit configuration.

This circuit has an arrangement in which a P-channel transistor Q5 and an N-channel transistor Q6 respectively for receiving erase control signals A and B at the gates are connected in series between the power supply terminal of a write/erase voltage Vpp and a ground potential point, and the source voltage Vs is output from this series-connecting point.

In this circuit, when the erase control signals A and B change to active low, the transistor Q6 is turned off, and the transistor Q5 is turned on to apply the source voltage Vs of the write/erase voltage Vpp level to the sources of all the memory cell transistors MT.

In this circuit, the source voltage Vs and the source current (Is) to be supplied to the sources of the memory cell transistors MT are set and controlled by the characteristics of the transistor Q5 so as to fall within the range of an inter-band tunnel current in the cell erase characteristic. However, the source voltage Vs and the source current (Is) may shift to the range wherein an avalanche breakdown current flows due to variations in manufacturing process, the charge amount accumulated in a floating gate, and the like. The degradation speed of the characteristics of the memory cell transistors MT undesirably increases.

For this reason, a method of preventing the source current (Is) from entering the region of the avalanche breakdown current by arranging a transistor Q7 which limits the source current Is, as shown in FIG. 3B, has been proposed (see, e.g., Japanese Unexamined Patent Publication No. 5-182483).

In this circuit, the depletion N-channel transistor Q7 having a drain connected to the drain of the transistor Q5 and a source and gate connected to the output terminal of the source voltage Vs and the drain of the transistor Q6 is arranged between the output terminal of the source voltage Vs of the source voltage Vs and the drain of the transistor Q5 in the circuit of FIG. 3A. With the transistor Q7, as shown in a graph of FIG. 4, the source current can be suppressed to the range of the inter-band tunnel current by the characteristics of the transistor Q7 (solid and broken lines with constant Is) though the source current is in a current range (broken line in the upper side of FIG. 4) where the avalanche breakdown current flows when the source current is limited by only the characteristics of the transistor Q5. An increase in degradation progress speed of the characteristics of the memory cell transistors MT can be suppressed. Note that lines LCx represent the load characteristics.

The conventional nonvolatile semiconductor memory described above employs the circuit shown in FIG. 3B as the source power supply circuit 3x. The erase (source) current (Is) is suppressed by the transistor Q7 to the range (CCbt) of the inter-band tunnel current in the cell characteristic (CC), and an increase in degradation progress speed of the characteristics of the memory cell transistors MT is suppressed. However, this nonvolatile semiconductor memory has the following problem.

The erase operation of the memory cell transistor MT can be performed by extracting electrons in the floating gate to the source. At this time, the cell characteristics change depending on the charge amount in the floating gate. As shown in FIG. 5, with the progress of erasing, the cell characteristic curve lowers from CC-1 to CC-2 and from CC-2 to CC-3. Therefore, to always prevent the avalanche breakdown current from flowing through the source of the memory cell transistor MT, the characteristics of the transistor Q7 must be set to make the source current (Is) small. If the source current is made small, the erase time of the memory cell transistor MT increases.

SUMMARY OF THE INVENTION

The present invention has been made in consideration of the above situation, and has as its object to provide a nonvolatile semiconductor memory which can perform an erase operation within the range of an inter-band tunnel current without increasing the erase time, and can suppress degradation in characteristics of a memory cell transistor by the erase operation.

To achieve the above object, according to the basic aspect of the present invention, there is provided a source lines so as to decrease faster than the current decreased by a characteristic of the first transistor with an increase in source voltage in a range in which the source voltage is higher than the predetermined potential.

According to another aspect of the present invention, there is provided a nonvolatile semiconductor memory characterized in that the source power supply circuit is a circuit including a first P-channel transistor which receives a power supply voltage of predetermined level at a source and receives an erase control signal at a gate, a second P-channel transistor which has a source connected to a drain of the first transistor, and a gate and drain connected to an output terminal of the source voltage, and an N-channel transistor which has a source connected to a ground potential point, receives the erase control signal at a gate, and has a drain connected to the output terminal of the source voltage.

According to still another aspect of the present invention, there is provided a nonvolatile semiconductor memory characterized in that the source power supply circuit is a circuit including a first P-channel transistor which receives a power supply voltage of predetermined level at a source and receives an erase control signal at a gate, a second P-channel transistor which has a source connected to a drain of the first transistor, and a drain connected to an nonvolatile semiconductor memory which comprises a cell array prepared by arranging in pluralities of rows and columns memory cell transistors capable of writing and erasing data by electrically changing a threshold voltage, a plurality of word lines arranged in correspondence with the plurality of respective rows of the memory cell transistors of the cell array and connected to control gates of the memory cell transistors in corresponding rows, a plurality of digit lines arranged in correspondence with the plurality of respective columns of the memory cell transistors of the cell array and connected to drains of the memory cell transistors in corresponding columns, source lines connected to sources of the memory cell transistors in the pluralities of rows and columns of the cell array, and a source power supply circuit for applying a source voltage of predetermined level to the source lines in an erase operation, and erases by the source voltage data in the memory cell transistors in the pluralities of rows and columns of the cell array in the erase operation, characterized in that the source power supply circuit is a circuit including a first P-channel transistor which sets a current to be supplied to the source lines to a predetermined value in the erase operation in a range in which the source voltage is lower than a predetermined potential, and a second P-channel transistor which sets the current to be supplied to the output terminal of the source voltage, a third P-channel transistor which has a source connected to the output terminal of the source voltage, and a gate and drain connected to a gate of the second transistor, a resistor which has one terminal connected to the gate and drain of the third transistor, and the other terminal connected to a ground potential point, and an N-channel transistor which has a source connected to the ground potential point, receives the erase control signal at a gate, and has a drain connected to the output terminal of the source voltage.

Each of substrates of the first and second P-channel transistors in the second aspect may be connected to one of the source of each transistor and a supply terminal of the power supply voltage.

Each of substrates of the first and second P-channel transistors in the third aspect may be connected to one of the source of each transistor and a supply terminal of the power supply voltage, and a substrate of the third P-channel transistor may be connected to the source of the third transistor.

In the present invention having the above aspects, the source power supply circuit is the circuit including the first P-channel transistor which sets, in the erase operation, the source current of the memory cell transistor to a predetermined value in a range wherein the source voltage to be applied to the source of the memory cell transistor is lower than a predetermined potential, and the second P-channel transistor which sets the source current of the memory cell transistor so as to decrease faster than the current decreased by the characteristics of the first transistor with an increase in source voltage in a range wherein the source voltage is higher than the predetermined potential. With this arrangement, in the initial stage of a data erase operation, data can be erased by a relatively large current within the range of the inter-band tunnel current of a cell characteristic curve set by the first transistor. Even if the cell characteristic curve changes with the progress of erasing of data, the current can be set within the range of the inter-band tunnel current by the second transistor to prevent an avalanche breakdown current from flowing. Therefore, the erase time is hardly increased, and degradation in characteristics of the memory cell transistor by an erase operation can be effectively suppressed.

The above and other advantages, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIGS. 1A and 1B are a sectional view showing the structure of a memory transistor used in a general conventional nonvolatile semiconductor memory, and a graph showing cell characteristics, respectively;

DETAILED DESCRIPTION OF PREFERRED EMBODIMENTS

Preferred embodiments of the present invention will be described below with reference to the accompanying drawings (FIGS. 6A to 7B).

Figure 6A:
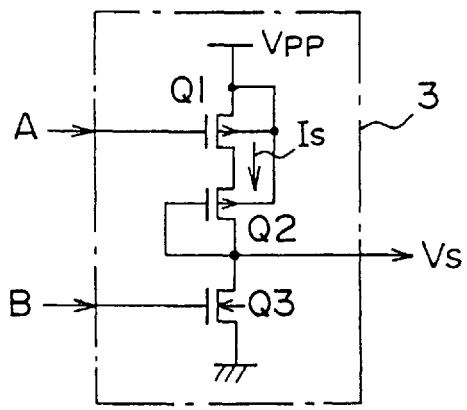
FIGS. 6A and 6B are a circuit diagram showing the configuration of a source power supply circuit used in the first embodiment of the present invention, and a graph for explaining the operation and effect, respectively.
Figure 6B:
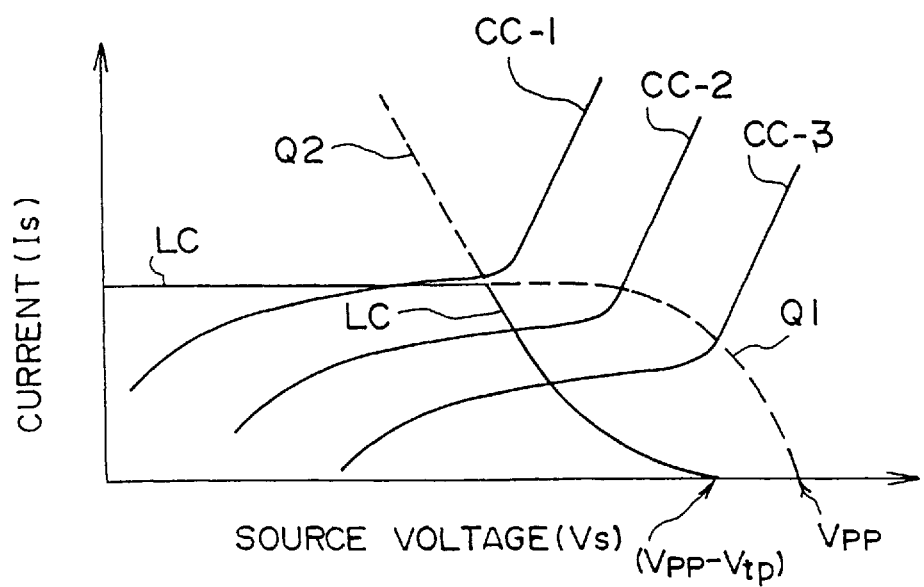

FIGS. 6A and 6B are a circuit diagram showing a detailed circuit of a source power supply circuit according to the first embodiment of the present invention, and a graph showing the load characteristic of this source power supply circuit together with cell characteristics, respectively.

Figure 2:
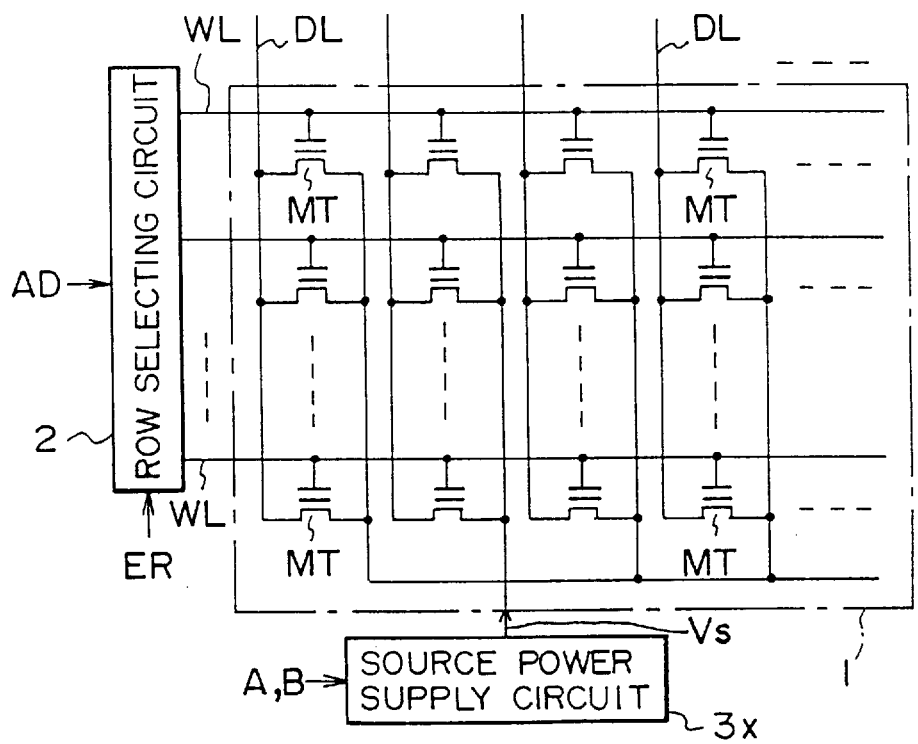
FIG. 2 is a diagram showing an example of the arrangement of a conventional nonvolatile semiconductor memory.
Figure 3A:
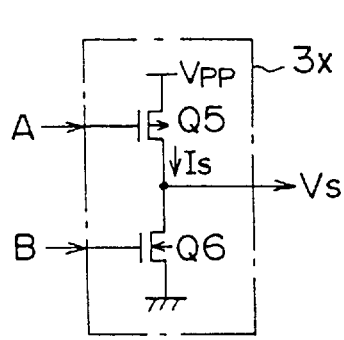
FIGS. 3A and 3B are circuit diagrams, respectively, showing detailed examples of a source power supply circuit in the prior art shown in FIG. 2.
Figure 3B:
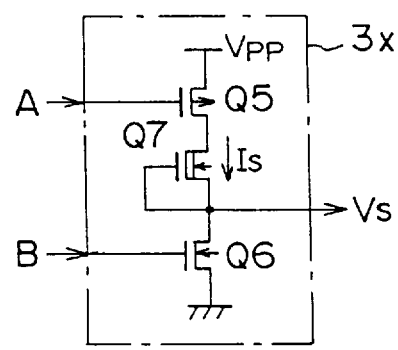
Figure 4:
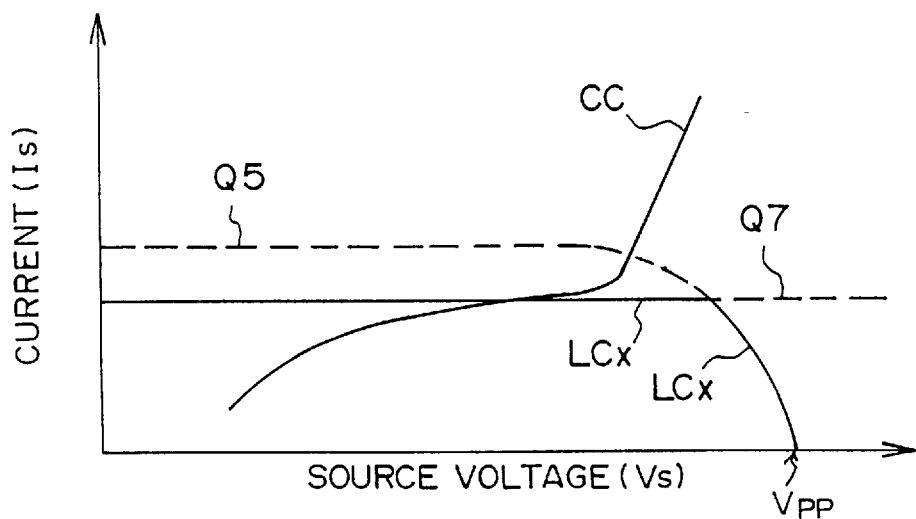
FIG. 4 is a graph for explaining the operation of the prior art shown in FIGS. 2, 3A, and 3B.
Figure 5:
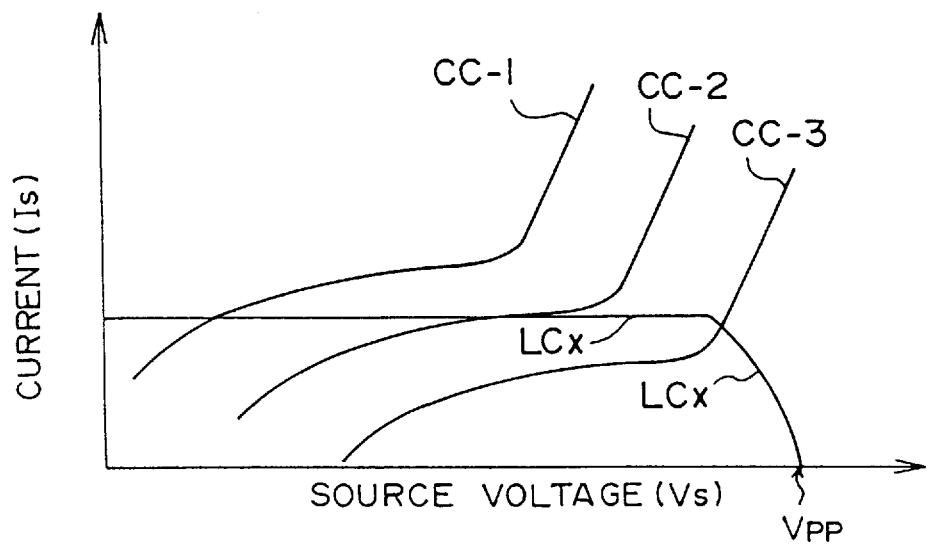
FIG. 5 is a graph for explaining the problem of the prior art shown in FIGS. 2 to 4.

The first embodiment is different from the conventional nonvolatile semiconductor memory shown in FIGS. 2, 3B, and 4 in that, in place of the source power supply circuit 3x shown in FIGS. 2 and 3B, this embodiment employs a source power supply circuit 3 which has a first P-channel transistor Q1 which receives a write/erase voltage Vpp at the source and an erase control signal A at the gate, a second P-channel transistor Q2 having a source connected to the drain of the transistor Q1 and a gate and drain connected to the output terminal of a source voltage Vs, and an N-channel transistor Q3 having a source connected to a ground potential point, a gate at which an erase control signal B is received, and a drain connected to the output terminal of the source voltage Vs. The power supply circuit 3 sets, in an erase operation by the erase control signals A and B of active level (low level), a current value (Is) to be supplied to the source of a memory cell transistor MT (see FIG. 2) to an almost predetermined value by the characteristics of the transistor Q1 in a range wherein the source voltage Vs is lower than a predetermined potential, and sets the current to be supplied to the source of the memory cell transistor MT by the characteristics of the transistor Q2 so as to decrease faster than the current decreased by the characteristics of the transistor Q1 with an increase in source voltage Vs in a range wherein the source voltage Vs to be applied to the source of the memory cell transistor MT is higher than the predetermined potential.

Note that FIG. 6A shows only the source power supply circuit 3, and the cell array 1, the row selecting circuit 2, the word lines WL, the digit lines DL, and the like shown in FIG. 2 are not illustrated.

An erase operation in the first embodiment will be described next.

When the erase control signals A and B are set active low, an erase operation starts to turn on the transistor Q1 and turn off the transistor Q3. Since both the gate and drain of the transistor Q2 are connected to the output terminal of the source voltage Vs, the source voltage Vs and the source current (Is) are supplied to the source of the memory cell transistor MT through the transistors Q1 and Q2.

If the source current (Is) is not limited by the transistor Q2, the relationship between the source voltage Vs and the source current (Is) exhibits a characteristic in which the source current (Is) is almost constant (solid line) during the source voltage Vs is low, starts to decrease when the source voltage Vs increases, and goes "0" (broken line) when the source voltage Vs reaches a write/erase voltage Vpp. On the other hand, if the source current (Is) is not limited by the transistor Q1, the relationship between the source voltage Vs and the source current (Is) exhibits a characteristic in which the source current (Is) starts to flow when the source voltage Vs is gradually decreased from the write/erase voltage Vpp to be lower by the threshold voltage Vtp of the transistor Q2 than the write/erase voltage Vpp, and the source voltage (Is) increases as the source voltage Vs decreases (from a solid line to a broken line on the extension line).

The relationship between the source voltage Vs and the source current (Is) with both the transistors Q1 and Q2 is therefore represented by a load characteristic curve LC indicated by a solid line in FIG. 6B. The source current (Is) is almost constant by the characteristics of the transistor Q1 in a range wherein the source voltage Vs is lower than a potential at which the characteristic curve of only the transistor Q1 and the characteristic curve of only the transistor Q2 cross each other. The source current (Is) decreases due to the characteristics of the transistor Q2 faster than a decrease in current due to the characteristics of the transistor Q1 with an increase in source voltage Vs in a range wherein the source voltage Vs is higher than the potential at this crossing point.

By supplying the source voltage Vs and the source current (Is) to the source of the memory cell transistor MT by the source power supply circuit 3 having this load characteristic, data can be erased by a relatively large current Is within the range of the inter-band tunnel current of a cell characteristic curve CC-1 in the initial stage of the erase operation (erasing) of data in the memory cell transistor MT. When the cell characteristic curve changes to CC-2 and CC-3 with the progress of erasing of data in the memory cell transistor MT, the source current (Is) is decreased by the transistor Q2 to be set within the range of the inter-band tunnel current in these cell characteristic curves CC-2 and CC-3. Therefore, data can be erased within the range of the inter-band tunnel current without almost increasing the erase time (i.e., scarcely decreasing the erase speed), and degradation in characteristics of the memory cell transistor MT can be suppressed.

Figure 7A:
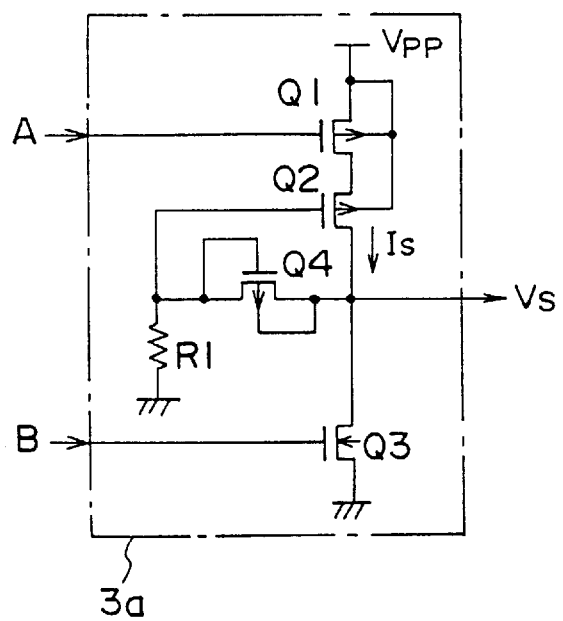
FIGS. 7A and 7B are a circuit diagram showing the configuration of a source power supply circuit used in the second embodiment of the present invention, and a graph for explaining the operation and effect, respectively.
Figure 7B:
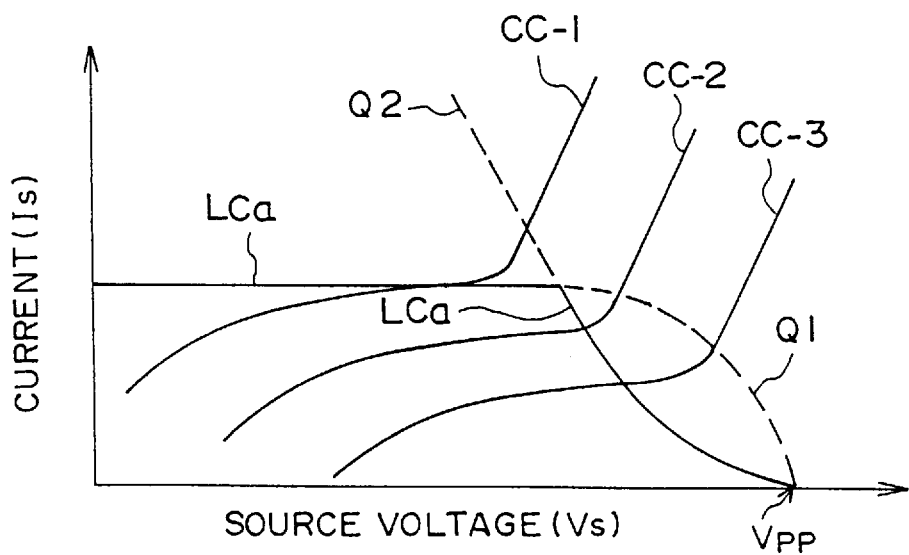

FIGS. 7A and 7B are a circuit diagram showing a detailed circuit of a source power supply circuit according to the second embodiment of the present invention, and a graph showing the load characteristic of this source power supply circuit together with cell characteristics, respectively.

A source power supply circuit 3a in the second embodiment is different from the source power supply circuit 3 in the first embodiment in that the gate of a transistor Q2 is separated from its drain and the output terminal of the source voltage Vs, and a third P-channel transistor Q4 having the source connected to the output terminal of the source voltage Vs and a gate and drain connected to the gate of the transistor Q2, and a resistor R1 connected between the gate of the transistor Q2 and a ground potential point are arranged.

By arranging the transistor Q4 and the resistor R1 in this manner, a voltage lower than the voltage to the source of the transistor Q2 by the threshold voltage of the transistor Q4 can be applied to the gate of the transistor Q2. Since the P-channel transistors Q1, Q2, and Q4 are normally formed by the same process, the threshold voltages of these transistors can be adjusted to almost the same value, and variations in threshold voltages caused by the process are in the same direction. The load characteristic of the transistor Q2 (the load characteristics of Q2 and Q4 because the transistor Q4 actually controls the gate voltage) does not depend on the threshold voltage of the transistor Q2, and is stable free from any variation caused by the process. Therefore, a stable erase characteristic can be obtained.

Figure 6C:
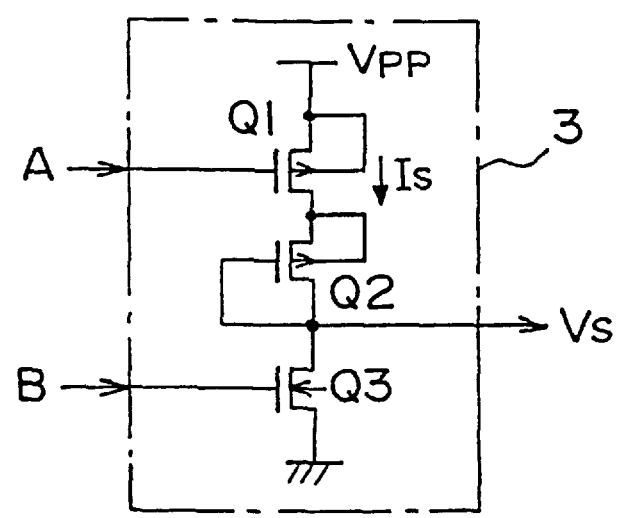
FIG. 6C illustrates an alternative embodiment of the invention.

In each embodiment, the substrates of the P-channel transistors Q1 and Q2 of the source power supply circuit 3 or 3a are connected to the source of the transistor Q1, i.e., the power supply terminal of the write/erase voltage Vpp, and the substrate of the P-channel transistor Q4 of the source power supply circuit 3a is connected to its source (Q4). In an erase operation, the source of the transistor Q2 is almost at the write/erase voltage Vpp because almost no voltage drop occurs in the transistor Q1. The substrate of the transistor Q2 is actually equivalent to a substrate connected to its source (Q2), as illustrated in FIG. 6C.

In the source power supply circuit 3 or 3a, the source voltage Vs or the like in an erase operation varies with the lapse of time. By connecting the substrates of the respective transistors Q1, Q2, and Q4 to their sources in this manner, variations (back-gate effect) in threshold voltages of these transistors due to variations in source voltage Vs and the like can be suppressed to obtain a stable load characteristic LCa.

What we claimed is:

1. A nonvolatile semiconductor memory which comprises a cell array prepared by arranging in pluralities of rows and columns memory cell transistors capable of writing and erasing data by electrically changing a threshold voltage, a plurality of word lines arranged in correspondence with the plurality of respective rows of said memory cell transistors of said cell array and connected to control gates of said memory cell transistors in corresponding rows, a plurality of digit lines arranged in correspondence with the plurality of respective columns of said memory cell transistors of said cell array and connected to drains of said memory cell transistors in corresponding columns, source lines connected to sources of said memory cell transistors in the pluralities of rows and columns of said cell array, and a source power supply circuit for applying a source voltage of predetermined level to said source lines in an erase operation, and erases by the source voltage data in said memory cell transistors in the pluralities of rows and columns of said cell array in the erase operation, wherein said source power supply circuit is a circuit including a first P-channel transistor which sets a current to be supplied to said source lines to a predetermined value in the erase operation in a range in which the source voltage is lower than a predetermined potential, and a second P-channel transistor which sets the current to be supplied to said source lines so as to decrease faster than the current decreased by a characteristic of said first transistor with an increase in source voltage in a range in which the source voltage is higher than the predetermined potential.

2. A device according to claim 1, wherein said source power supply circuit is a circuit including a first P-channel transistor which receives a power supply voltage of predetermined level at a source and receives an erase control signal at a gate, a second P-channel transistor which has a source connected to a drain of said first transistor, and a gate and drain connected to an output terminal of the source voltage, and an N-channel transistor which has a source connected to a ground potential point, receives the erase control signal at a gate, and has a drain connected to the output terminal of the source voltage.

3. A device according to claim 1, wherein said source power supply circuit is a circuit including a first P-channel transistor which receives a power supply voltage of predetermined level at a source and receives an erase control signal at a gate, a second P-channel transistor which has a source connected to a drain of said first transistor, and a drain connected to an output terminal of the source voltage, a third P-channel transistor which has a source connected to the output terminal of the source voltage, and a gate and drain connected to a gate of said second transistor, a resistor which has one terminal connected to the gate and drain of said third transistor, and the other terminal connected to a ground potential point, and an N-channel transistor which has a source connected to the ground potential point, receives the erase control signal at a gate, and has a drain connected to the output terminal of the source voltage.

4. A device according to claim 2, wherein each of substrates of said first and second P-channel transistors is connected to one of the sources of respective ones of said transistors and a supply terminal of the power supply voltage.

5. A device according to claim 3, wherein each of substrates of said first and second P-channel transistors is connected to one of the sources of respective ones of said transistors and a supply terminal of the power supply voltage, and a substrate of said third P-channel transistor is connected to the source of said third transistor.

* * * * *